US008921855B2

(12) United States Patent
Okita et al.

(10) Patent No.: US 8,921,855 B2
(45) Date of Patent: Dec. 30, 2014

(54) TEST CIRCUIT FOR TESTING SIGNAL RECEIVING UNIT, IMAGE PICKUP APPARATUS, METHOD OF TESTING SIGNAL RECEIVING UNIT, AND METHOD OF TESTING IMAGE PICKUP APPARATUS

(75) Inventors: Akira Okita, Yamato (JP); Masaaki Iwane, Sagamihara (JP); Yu Arishima, Yokohama (JP); Masaaki Minowa, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 151 days.

(21) Appl. No.: 13/410,547

(22) Filed: Mar. 2, 2012

(65) Prior Publication Data

US 2012/0228609 A1  Sep. 13, 2012

(30) Foreign Application Priority Data

Mar. 9, 2011 (JP) ................................. 2011-051692

(51) Int. Cl.
| | |
|---|---|
| *H01L 27/142* | (2014.01) |
| *H04N 5/374* | (2011.01) |
| *H01L 27/06* | (2006.01) |
| *H04N 5/378* | (2011.01) |
| *H04N 17/00* | (2006.01) |
| *H01L 29/10* | (2006.01) |
| *H01L 27/148* | (2006.01) |

(52) U.S. Cl.
CPC ............ *H04N 5/374* (2013.01); *H01L 29/1029* (2013.01); *H01L 27/14806* (2013.01); *H01L 27/0605* (2013.01); *H04N 5/378* (2013.01); *H04N 17/002* (2013.01)
USPC ............. 257/48; 257/222; 257/223; 257/229; 257/E21.551; 438/11; 438/14; 438/18

(58) Field of Classification Search
CPC ............ H01L 29/1054; H01L 27/0605; H01L 29/1029; H01L 29/20003; H01L 22/34; H01L 2924/01079; H01L 2924/01013; H01L 27/14887; H01L 27/14806; H01L 27/16343; H04N 5/374; H04N 17/002; H04N 5/378
USPC ..................... 257/48, 223, 225, 229, E27.123, 257/E21.351, 21, 222; 438/18, 11, 14, 15
See application file for complete search history.

(56) References Cited

U.S. PATENT DOCUMENTS

| | | | |
|---|---|---|---|
| 2008/0297629 A1* | 12/2008 | Kitani | ........................... 348/247 |
| 2010/0091160 A1 | 4/2010 | Murakami | |
| 2011/0242375 A1* | 10/2011 | Cieslinski | ..................... 348/294 |

FOREIGN PATENT DOCUMENTS

| | | |
|---|---|---|
| CN | 101601281 A | 12/2009 |
| JP | H11-308531 A | 11/1999 |

(Continued)

OTHER PUBLICATIONS

Machine translation of Japanese Patent JP2000-324404 assigned to Osawa et al. Date:Nov. 24, 2000 Toshiba Corp.*

*Primary Examiner* — Thinh T Nguyen
(74) *Attorney, Agent, or Firm* — Canon USA, Inc. IP Division

(57) ABSTRACT

It is disclosed that, as an embodiment, a test circuit includes a test signal supply unit configured to supply a test signal via a signal line to signal receiving units provided in a plurality of columns, wherein the test signal supply unit is a voltage buffer or a current buffer, and the test circuit has a plurality of test signal supply units and a plurality of signal lines, and wherein at least one test signal supply unit is electrically connected to one signal line different from a signal line to which another test signal supply unit is electrically connected.

7 Claims, 10 Drawing Sheets

(56) References Cited

FOREIGN PATENT DOCUMENTS

| | | | |
|---|---|---|---|
| JP | 2000-324404 A | 11/2000 |
| JP | 2004-165825 A | 6/2004 |
| JP | 2008-067084 A | 3/2008 |
| JP | 2008-160344 A | 7/2008 |
| JP | 2011-029734 A | 2/2011 |

* cited by examiner

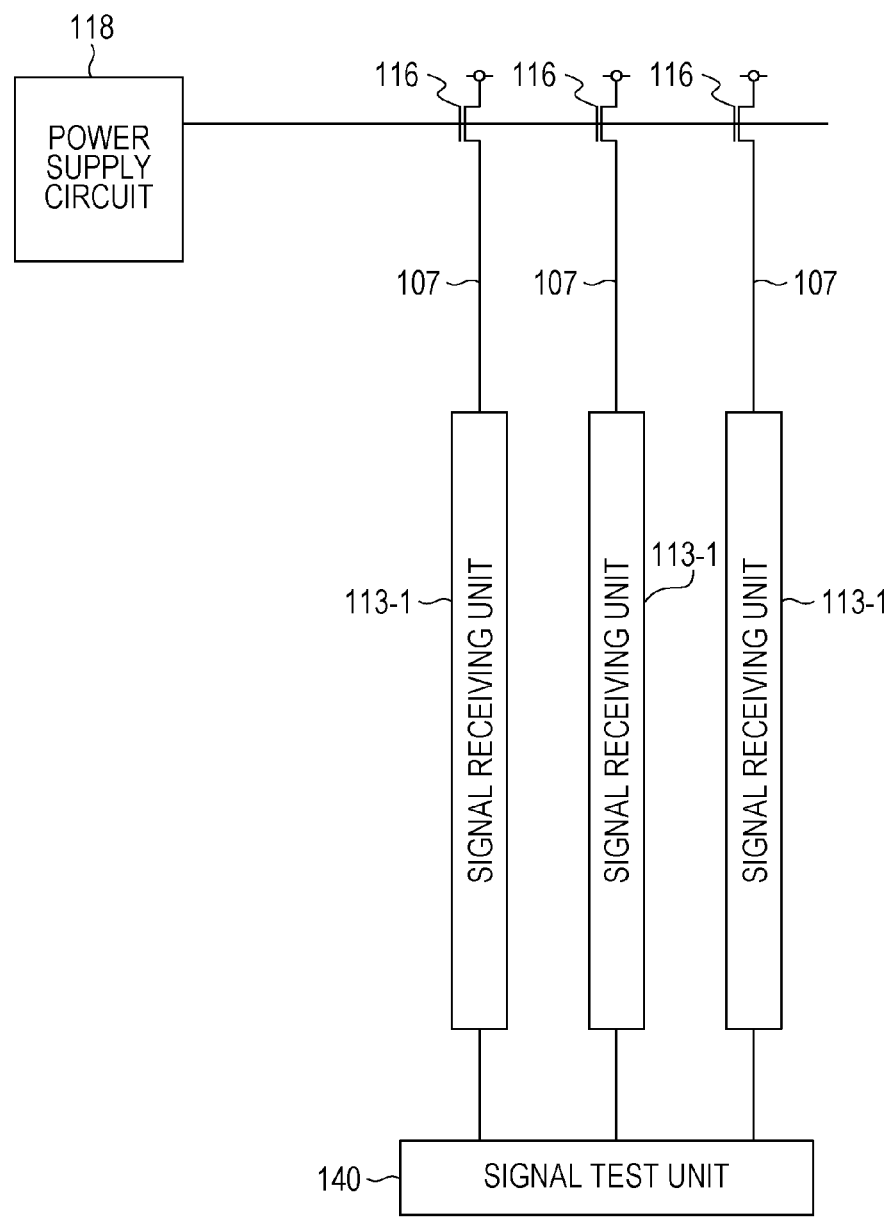

TEST CIRCUIT FOR TESTING SIGNAL RECEIVING UNIT, IMAGE PICKUP APPARATUS, METHOD OF TESTING SIGNAL RECEIVING UNIT, AND METHOD OF TESTING IMAGE PICKUP APPARATUS

BACKGROUND OF THE INVENTION

1. Field of the Invention

Embodiments of the present invention relate to a test circuit for testing a signal receiving unit, an image pickup apparatus, a test system for testing a signal receiving unit, a method of testing a signal receiving unit, and a method of testing an image pickup apparatus.

2. Description of the Related Art

An apparatus is known in which signal lines are provided in a plurality of columns and a signal receiving unit (hereinafter, referred to as an SRU) is connected to each signal line. Examples of such apparatuses include a storage device such as a memory, a display such as a liquid crystal panel, a Complementary Metal Oxide Semiconductor (CMOS)-type image pickup apparatus having SRUs for reading signals from pixels, an image pickup apparatus using bipolar transistors, etc. Japanese Patent Laid-Open No. 2000-324404 discloses an image pickup apparatus having a function of testing characteristics of a circuit provided in each column for processing a signal.

In the image pickup apparatus disclosed in Japanese Patent Laid-Open No. 2000-324404, to make it possible to measure the characteristic of an analog-to-digital converter that converts an analog signal output from a pixel into a digital signal, a test signal generator is connected to a vertical signal line. In this configuration, a current is supplied from the test signal generator to the vertical signal line, and the characteristic of the analog-to-digital converter connected to the vertical signal line is measured.

In the configuration disclosed in Japanese Patent Laid-Open No. 2000-324404, the test signal is supplied to pixels in all columns from the single test signal generator, and thus the impedance of an electrical path from the test signal generator to the respective vertical signal lines increases with the distance from the test signal generator. As a result, a great difference occurs in test signal supplied to the respective SRUs as of when the supplying of the test signal to the SRUs is started. Therefore, if the test is performed without waiting for the difference in test signal supplied to the SRUs to become small, an increase occurs in accuracy of the measurement. The test accuracy may be increased if the test is performed after the difference in test signal supplied to the SRUs has become small enough. However, waiting for the difference to become small causes an increase in test time.

SUMMARY OF THE INVENTION

According to one of the aspects of the present embodiments, it is disclosed that a test circuit includes a test signal supply unit configured to supply a test signal via a signal line to signal receiving units provided in a plurality of columns, wherein the test signal supply unit is a voltage buffer or a current buffer, and the test circuit has a plurality of test signal supply units and a plurality of signal lines, wherein at least one test signal supply unit is electrically connected to one signal line different from a signal line to which another test signal supply unit is electrically connected.

According to another aspect of the present embodiments, it is disclosed that a method of testing signal receiving units provided in a plurality of columns, including supplying a test signal to the signal receiving units from a plurality of voltage buffers or current buffers functioning as test signal supply units such that one of the test signal supply units supplies the test signal to a signal receiving unit different from a signal receiving unit to which the test signal is supplied from another different test signal supply unit; and testing the signal receiving units using the test signal supplied to the signal receiving units.

Further features of the embodiments will become apparent from the following description of exemplary embodiments with reference to the attached drawings.

BRIEF DESCRIPTION OF THE DRAWINGS

FIG. 9 is a block diagram schematically illustrating an example of an SRU test circuit according to an embodiment.

DESCRIPTION OF THE EMBODIMENTS

Figure 1:
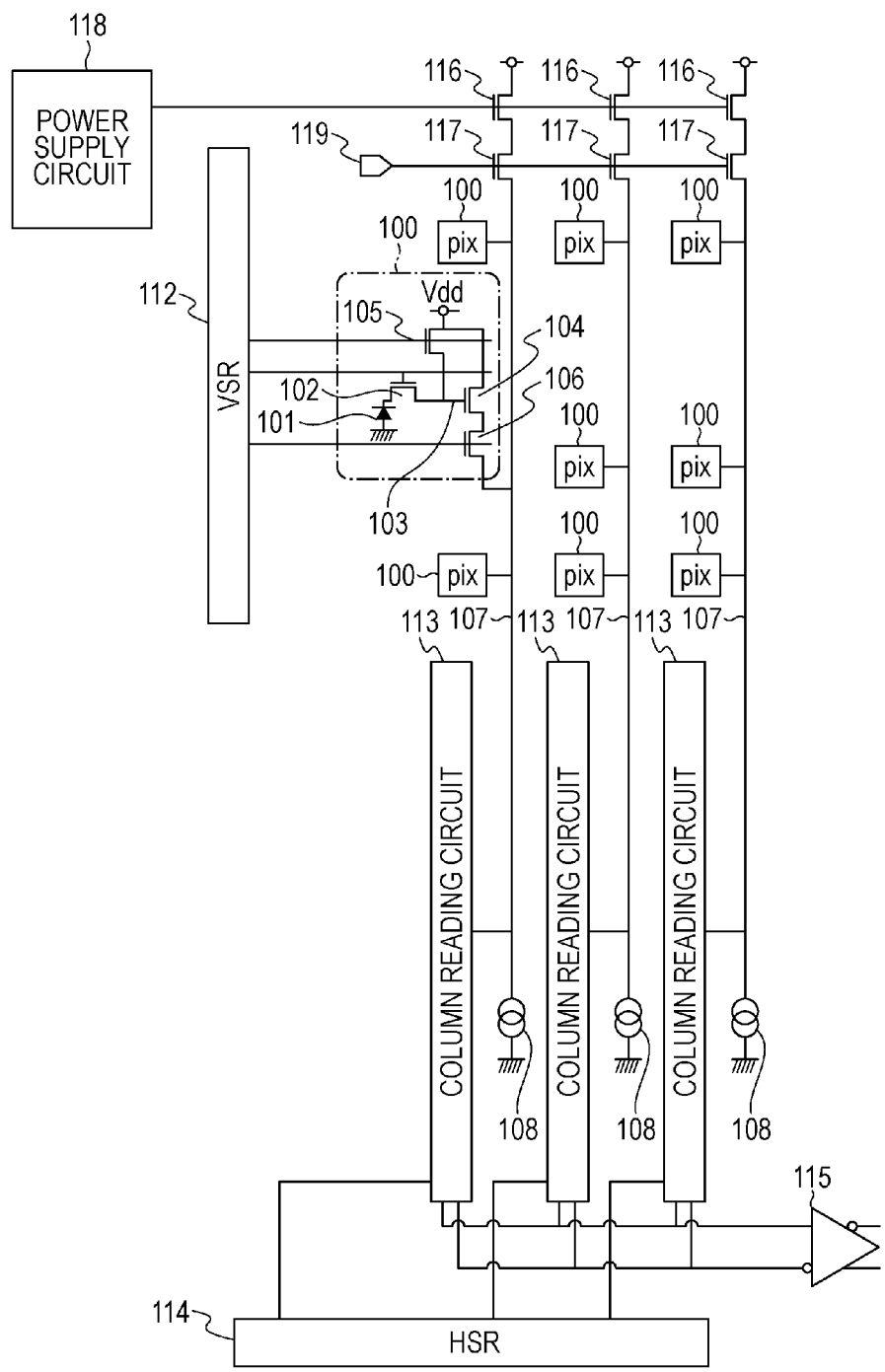
FIG. 1 is a block diagram schematically illustrating a first embodiment.

First, a description is given below as to a configuration and a test operation of an SRU test circuit according to an embodiment. One disclosed feature of the embodiments may be described as a process which is usually depicted as a flowchart, a flow diagram, a timing diagram, a structure diagram, or a block diagram. Although a flowchart or a timing diagram may describe the operations or events as a sequential process, the operations may be performed, or the events may occur, in parallel or concurrently. An operation in a flowchart may be optional. In addition, the order of the operations or events may be re-arranged. A process is terminated when its operations are completed. A process may correspond to a method, a program, a procedure, a method of manufacturing or fabrication, a sequence of operations performed by an apparatus, a machine, or a logic circuit, etc.

FIG. 9 is a block diagram schematically illustrating an example of an SRU test circuit according to an embodiment. A power supply circuit 118 is electrically connected to buffers 116 serving as test signal supply units. In this example, a common-drain amplifier circuit using a MOS transistor is employed as each buffer 116. The power supply circuit 118 is a power supply that drives the buffers 116 to supply a test signal. More specifically, based on a signal supplied from the power supply circuit 118, the buffers 116 generate the test signal and supply the resultant test signal. Note that the SRU test circuit has a plurality of buffers 116, and there is provided at least one buffer 116 electrically connected to a signal line 107 different from a signal line 107 to which another different one of the buffers 116 is electrically connected. Signal receiving units (SRUs) 113-1 are provided such that each SRU 113-1 is electrically connected to one of the buffers 116 via a corresponding one of the signal lines 107. Thus, the signal lines 107 serve to transmit the test signal supplied from the buffers 116 to the SRUs 113-1. In addition to the signal lines 107, the SRUs 113-1 are electrically connected also to a signal test unit 140.

Next, an operation of the SRU test circuit illustrated schematically in FIG. 9 is described below.

When the signal supplied from the power supply circuit 118 is input to one of the buffers 116, the buffer 116 generates the test signal. The test signal generated by the buffer 116 is sent to one of the SRUs 113-1 via a corresponding one of the signal lines 107. The SRU 113-1 performs signal processing based on the input test signal. The result of the signal processing is output to the signal test unit 140. Based on the received result of the signal processing, the signal test unit 140 tests the SRU 113-1 as to, for example, whether the SRU 113-1 operates correctly, differences in characteristics of SRUs 113-1 among columns, etc.

In the present embodiment, the plurality of the buffers 116 are provided such that one of the buffers 116 supplies the test signal to one SRU 113-1 different from another SRU 113-1 to which the test signal is supplied by another different one of the buffers. Furthermore, there is at least one buffer 116 electrically connected to a signal line 107 different from another signal line 107 electrically connected to another one of the buffers 116. This reduces a difference in impedance of the signal line 107 among columns as of when the supplying of the test signal is started, and thus a reduction is achieved in difference in the test signal received by the respective SRUs 113-1, which makes it possible to accurately measure the characteristic of each SRU 113-1.

In the example shown in FIG. 9, the voltage buffer is used as the buffer 116. Alternatively, a current buffer may be employed as the buffer 116. Also in the case where a current buffer is used as the buffer 116, it is possible to achieve a reduction in difference in impedance among columns, and thus it is possible to achieve similar advantages to those obtained when the buffer 116 is of the voltage buffer type.

A connection terminal may be disposed between each buffer 116 and the corresponding signal line 107 such that the buffers 116 and the signal lines 107 may be electrically and mechanically connected and disconnected. That is, the buffers 116 may be disposed on a substrate different from a substrate on which the signal lines 107 are disposed. Furthermore, the signal test unit 140 may be disposed on a substrate different from a substrate on which the SRUs 113-1 are disposed. A tester may be configured such that it includes the signal test unit 140, the buffers 116, and the power supply circuit 118, and this tester may be connected to the SRUs 113-1 to test the SRUs 113-1.

The power supply circuit 118 may be configured to select a voltage value from two or more voltage values depending on the gain of the SRU 113-1 and supply the selected voltage value. This makes it possible for the buffers 116 to supply a test signal adapted depending on the gain of the SRU 113-1.

The SRU 113-1 may be configured to perform correlated double sampling (hereinafter referred to as CDS). By configuring the power supply circuit 118 to switch the voltage value among two or more values and configuring the SRUs 113-1 to perform CDS, it becomes possible to reduce the difference in characteristic among the buffers 116.

In the example of the SRU test circuit shown in FIG. 9, one signal line 107 is provided for each column of SRUs 113-1. Alternatively, one signal line 107 may be shared by a plurality of SRUs 113-1. Conversely, a plurality of signal lines 107 may be provided for each column.

As for the buffers 116, in the example of the SRU test circuit shown in FIG. 9, one buffer 116 is connected to each signal line 107. Alternatively, one buffer 116 may be connected to a plurality of signal lines 107, or conversely, a plurality of buffers 116 may be connected to one signal line 107. That is, the SRU test circuit may be configured in many manners as long as a plurality of buffers 116 are provided, and there is at least one buffer 116 electrically connected to one signal line 107 different from another signal line 107 to which another buffer 116 is electrically connected.

The SRU test circuit according to the present embodiment may be used to test SRUs electrically connected to a plurality of signal lines in an apparatus. Examples of apparatuses in which SRUs are electrically connected to a plurality of signal lines include a storage device such as a memory, a display such as a liquid crystal panel, a CMOS-type image pickup apparatus, an image pickup apparatus using bipolar transistors, etc. That is, the SRUs of these apparatuses may be tested according to the present embodiment.

First Embodiment

A first embodiment is described below. In this embodiment, an SRU test circuit is used to test a column reading circuit serving as an SRU in an image pickup apparatus. First, a configuration of the image pickup apparatus is described, and then an operation of testing the column reading circuit of the image pickup apparatus is described.

In the following explanation, by way of example, it is assumed that a signal output unit of a pixel is configured using an N-channel transistor. In a case where a P-channel transistor is used to form the signal output unit of the pixel, the present embodiment may be applied if the voltage polarity of the test signal is set to be opposite to the polarity used for the N-channel transistor.

FIG. 1 is a block diagram schematically illustrating an example of an image pickup apparatus according to the present embodiment. Referring to FIG. 1, the image pickup apparatus according to the present embodiment is described below. In FIG. 1, elements that are similar in function to those shown in FIG. 9 are denoted by similar reference symbols or numerals.

Each pixel 100 includes a photoelectric conversion unit 101, a floating diffusion part (hereinafter, referred to as an FD part) 103, an amplifying MOS transistor 104, a reset MOS transistor 105 serving as a reset unit, and a selection MOS transistor 106. Pixels 100 are arranged in an array including a plurality of rows and a plurality of columns. The photoelectric conversion unit 101 converts incident light into an electric charge. In the present example, a photodiode is used as the photoelectric conversion unit 101. The transfer MOS transistor 102 transfers the electric charge from the photodiode 101 to the FD part 103. A gate of the transfer MOS transistor 102 is connected, via a driving line, to a vertical shift register (hereinafter, referred to as a VSR) 112 that scans the pixels 100 on a row-by-row basis.

The FD part 103 is electrically connected to the gate of the amplifying MOS transistor 104. The amplifying MOS transistor 104 serves as a signal output unit that amplifies a signal based on the electric charge of the FD part 103 and outputs the resultant signal. A drain of the amplifying MOS transistor 104 is supplied with a power supply voltage Vdd, and a source of the amplifying MOS transistor 104 is electrically connected to a source of the selection MOS transistor 106. The selection MOS transistor 106 is disposed in an electrical path between the amplifying MOS transistor 104 and a vertical signal line 107, and a gate thereof is electrically connected to the VSR 112 via a driving line. By supplying a selection pulse from the VSR 112 to the gate of the selection MOS transistor 106, it is possible to select a pixel from which the amplified signal output by the amplifying MOS transistor 104 is output to the vertical signal line 107 serving as the signal line.

The reset MOS transistor 105 is connected such that a source thereof is electrically connected to the FD part 103, and a drain thereof is supplied with the power supply voltage Vdd. That is, in the present embodiment, the drain voltage of the amplifying MOS transistor 104 and the drain voltage of the reset MOS transistor 105 are equally set to the power supply voltage Vdd. Furthermore, a gate of the reset MOS transistor 105 is electrically connected to the VSR 112 via a driving line. When a reset pulse output from the VSR 112 is applied to the reset MOS transistor 105, the reset MOS transistor 105 resets the potential of the FD part 103.

Each vertical signal line 107 is electrically connected to a constant current source 108. The signal output by the amplifying MOS transistor 104 is transmitted to a column reading circuit 113 serving as the SRU via the selection MOS transistor 106 and the vertical signal line 107. Note that the signal output from the amplifying MOS transistor 104 to the vertical signal line 107 is the pixel signal. Each column reading circuit 113 is electrically connected to a horizontal shift register (hereinafter, referred to as an HSR) 114 that scans the column reading circuits 113, and also to an output amplifier 115. The signals read out by the column reading circuits 113 are sequentially output by the HSR 114 to the output amplifier 115, which outputs the signal from the image pickup apparatus.

Each vertical signal line 107 is electrically connected to one of the buffers 116 via corresponding one of test selection MOS transistors 117. More specifically, the vertical signal line 107 is electrically connected to the source serving as an output terminal of the buffer 116 via the test selection MOS transistor 117. The gate of the buffer 116 is electrically connected to a power supply circuit 118 including a voltage source. The drain of the buffer 116 is supplied with the power supply voltage Vdd. The gate of the test selection MOS transistor 117 is electrically connected to a test pulse apply terminal 119.

Next, referring to a drive timing chart shown in FIG. 2, a description is given below as to the signal read process in the image taking operation performed by the image pickup apparatus shown in FIG. 1.

Figure 2:
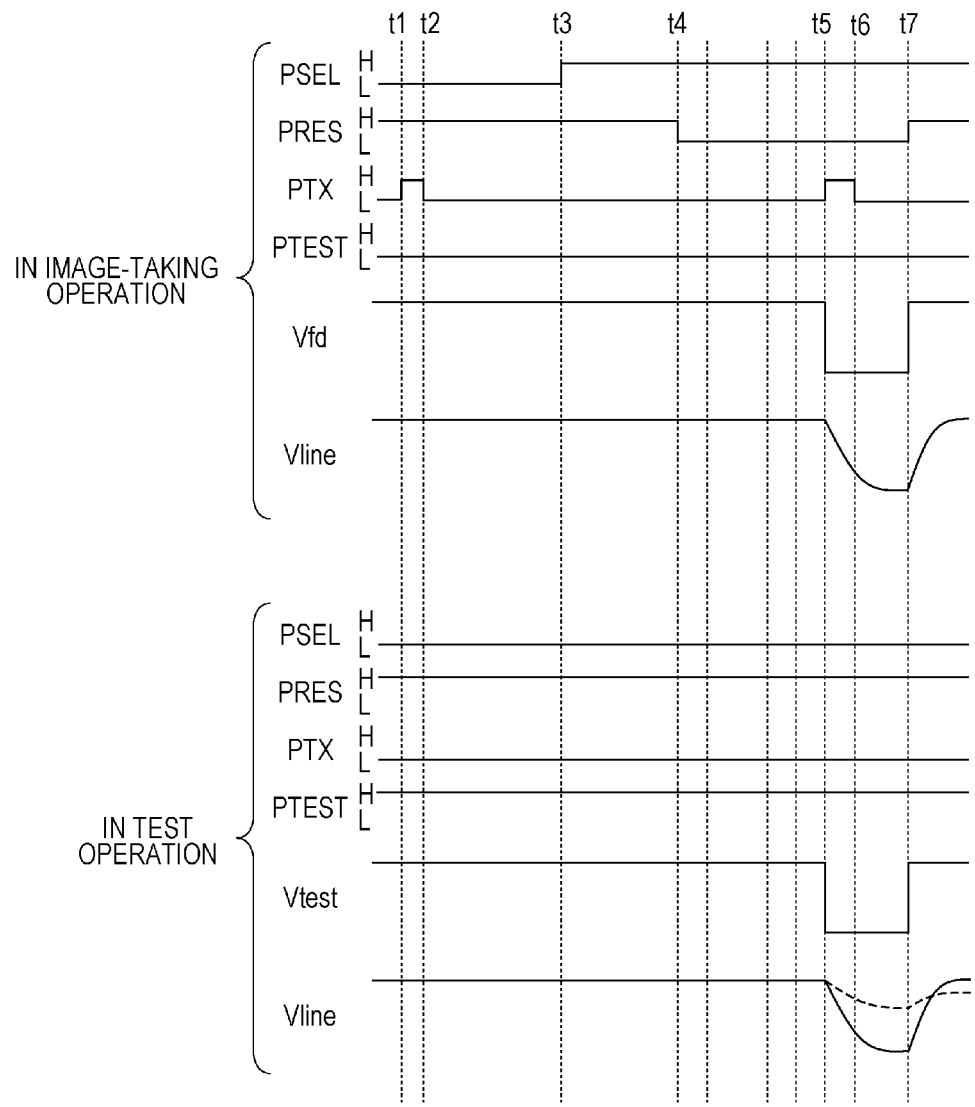
FIG. 2 is a drive timing chart according to the first embodiment.

In FIG. 2, PSEL denotes a pulse applied to the gate of the selection MOS transistor 106. PRES denotes a reset pulse applied to the gate of the reset MOS transistor 105. PTX denotes a pulse applied to the gate of the transfer MOS transistor 102. PTEST denotes a pulse applied to the test selection MOS transistor 117 from the test pulse apply terminal 119. During a signal reading period in the operation of taking an image, the potential of PTEST is at a low level (hereinafter, referred to as an L level), and thus the test selection MOS transistor 117 is in an OFF state. Vfd denotes the potential of the FD part 103 of the selected pixel. Vline denotes the potential of the vertical signal line 107.

At time t1, PRES is at a high level (hereinafter, referred to as an H level) and PTX is turned to the H level to reset the electric charge of the photodiode 101.

At time t2, PTX is turned to the L level. During an arbitrary period from time t2 to time t5, the photodiode 101 converts incident light into an electric charge. After the electric charge has been accumulated by the photodiode 101 for a particular period, the VSR 112 performs a reading operation while sequentially selecting pixel rows. At time t3, PSEL of the selected pixel row is turned to the H level thereby to turn on the selection MOS transistor 106. As a result, the signal amplified by the amplifying MOS transistor 104 is output to the vertical signal line 107.

At time t3, PRES still remains at the H level, and the FD part 103 has been reset. The signal based on the potential obtained after the resetting of the FD part 103 is amplified by the amplifying MOS transistor 104, and the resultant amplified signal is transmitted to the column reading circuit 113 via the selection MOS transistor 106 and the vertical signal line 107.

At time t4, PRES is turned to the L level to release the FD part 103 from the reset state.

PTX is turned to the H level at time t5 and to the L level at time t6 whereby the electric charge accumulated in the photodiode 101 is transferred to the FD part 103.

The signal based on the potential of the FD part 103 in this state is amplified by the amplifying MOS transistor 104, and the resultant amplified signal is transmitted to the column reading circuit 113 via the vertical signal line 107.

A transient response speed of Vline of the vertical signal line 107 depends on a time constant CR associated with the pixel 100 where C is capacitance associated with the vertical signal line 107 and R is resistance of the vertical signal line 107. The greater the time constant CR, the slower the transient response speed. Therefore, the time needed for the transient response of Vline to converge increases with increasing number of pixels electrically connected to the vertical signal line, i.e., with increasing number of pixels functioning as loads.

At time t7, PRES is again turned to the H level to reset the potential of the FD part 103.

Next, an operation of testing the column reading circuit 113 is explained.

First, PSEL is turned to the L level for all rows of the image pickup apparatus such that no signal is output from any pixel in the image pickup apparatus. When PTEST is then turned to the H level, the test selection MOS transistor 117 turns on, and the power supply circuit 118 operates in a source follower mode with the constant current source 108. The operation in the source follower mode is similar to that of the amplifying MOS transistor 104 in the image taking operation.

During the operation of testing the column reading circuit 113, PTEST is maintained at the H level, and the power supply circuit 118 supplies a test signal Vtest to the buffer 116.

In a case where the apparatus does not have a plurality of buffers 116 or in a case where although the apparatus has a plurality of buffers 116, all vertical signal lines 107 are not electrically connected to some of the buffers 116, the time constant CR increases with the distance from the power supply circuit 118, and thus the time needed for the transient response of Vline to converge increases with the distance from the power supply circuit 118. If the test is performed after the long transient response of Vline converges, a long time is needed for the test. If the applying of the test signal Vtest is ended before the transient response converges, a reduction in test accuracy occurs.

In contrast, the configuration according to the present embodiment reduces the difference in time constant CR over the whole path from the power supply circuit 118 to the column reading circuits 113. This results in a reduction in a column-to-column measurement error in testing the column reading circuits 113.

The time constant CR of the vertical signal line 107 in the test operation is equal to that in the image taking operation.

Therefore, by setting the test signal Vtest to a potential corresponding to the potential of the FD part 103 in the image taking operation, it is possible to test the column reading circuits 113 under conditions similar to those in the image taking operation.

As described above, in the image taking operation, the signal based on the photoelectric conversion is output to the vertical signal line 107 at time t5. In the test operation, the test signal is output to the vertical signal line 107 at time t5. Therefore, it is not necessary to change the sequence of the operation of the column reading circuit 113 between the image taking operation and the test operation. This makes it easier to perform the test.

In the present embodiment, it is assumed by way of example that the MOS transistors are used in the image sensor device. Note that the pixels 100 may be configured in another manner as long as incident light is converted to an electric charge and a signal based on the electric charge is output. Such pixels for the image sensor device may be configured, for example, using bipolar transistors. Examples of light incident on the photodiode 101 include infrared light, visible light, ultraviolet light, and radiation rays (X-ray, γ-ray, etc.). In a case where the incident light is a radiation ray, a scintillator may be used to convert wavelength and resultant light with the converted wavelength may be converted to an electric charge by the photoelectric conversion unit.

Figure 10:
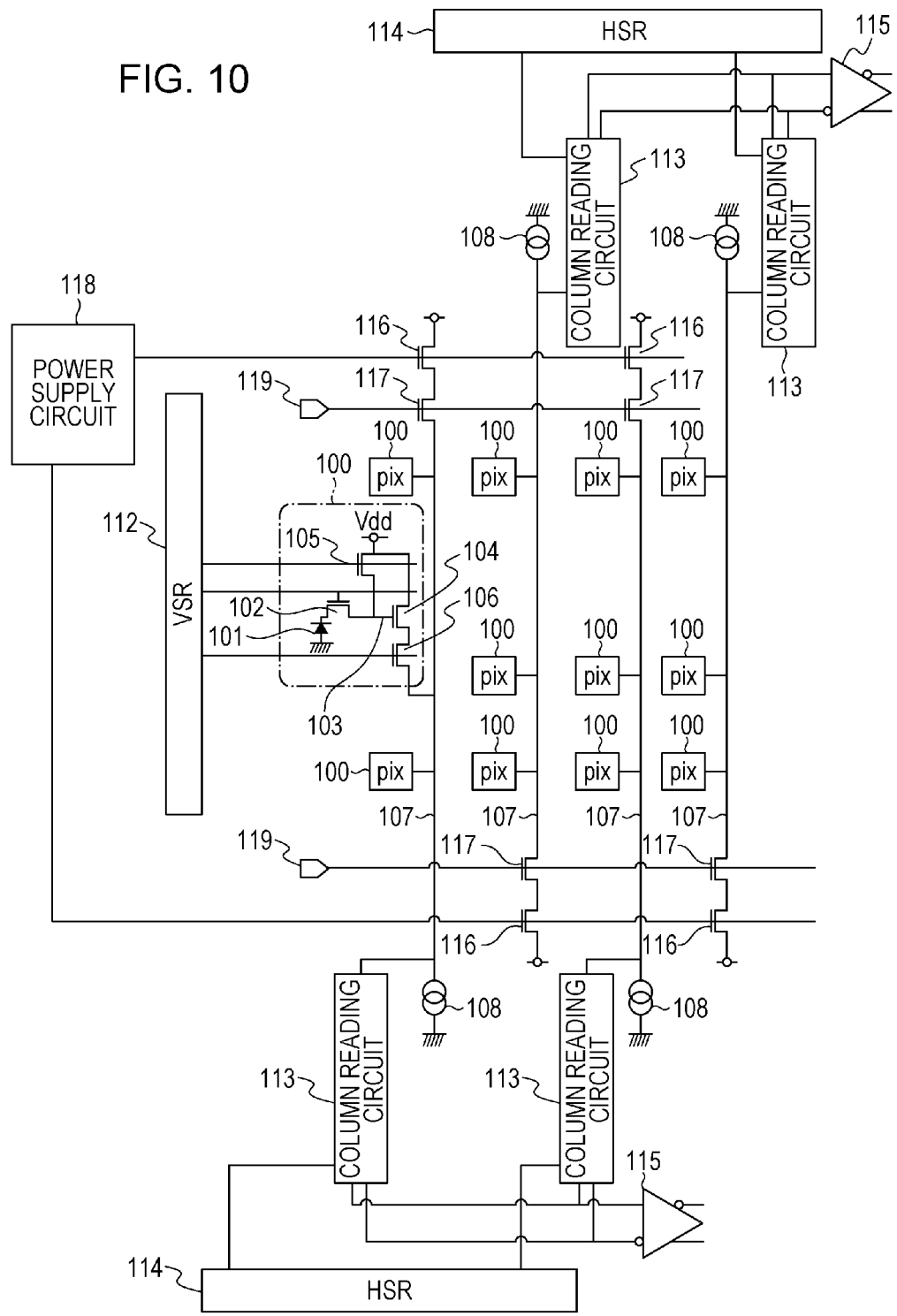
FIG. 10 is a block diagram schematically illustrating another configuration according to the first embodiment.

FIG. 10 illustrates an example of an image pickup apparatus in which column reading circuits 113 are arranged on two sides opposing via a pixel array area in which pixels 100 are arranged. In FIG. 10, elements that are similar in function to those shown in FIG. 1 are denoted by similar reference symbols or numerals, and a further description thereof is omitted. The present embodiment may also be applied to an image pickup apparatus in which column reading circuits 113 are arranged on two sides opposing via a pixel array area in which pixels 100 are arranged as shown in FIG. 10. Although in the example shown in FIG. 10, column reading circuits 113 are disposed on opposite sides alternately every column, column reading circuits 113 may be disposed on opposite sides alternately every two or more columns. In the configuration in which the column reading circuits 113 are arranged on two sides opposing via the pixel array area, buffers 116 and test selection MOS transistors 117 are also disposed on two sides opposing via the pixel array area. Separate power supply circuits 118 and separate test pulse apply terminals 119 may be provided for the buffers 116 and the test selection MOS transistors 117 on the respective opposing sides. However, to achieve high equality in terms of the signal level of the test signals applied to the respective columns, the single power supply circuit 118 and the single test pulse apply terminal 119 may be connected to all buffers 116 and test selection MOS transistors 117 located on both opposite sides.

In the above-described examples, the pixels 100 are arranged in an array including a plurality of columns and a plurality of rows. The array of pixels 100 may include only one row if the array includes a plurality of columns, as in the case of a line sensor. In the case of the line sensor including only one row, the selection MOS transistors 106 may not be provided.

In each pixel 100 according to the present embodiment described above, the source of the amplifying MOS transistor 104 is electrically connected to the drain of the selection MOS transistor 106. Alternatively, the drain of the amplifying MOS transistor 104 may be electrically connected to the source of the selection MOS transistor 106.

In the examples described above, one vertical signal line 107 is disposed in each column of pixels 100. Alternatively, one vertical signal line 107 may be shared by a plurality of columns of pixels. Conversely, a plurality of vertical signal lines 107 may be provided for each column of pixels. As for the buffers 116, in the example of the image pickup apparatus described above, one buffer 116 is connected to each signal line 107. Alternatively, one buffer 116 may be connected to a plurality of signal lines 107. That is, the image pickup apparatus may be configured in many manners as long as a plurality of buffers 116 are provided and there is at least one buffer 116 electrically connected to one vertical signal line 107 different from another vertical signal line to which another buffer 116 is electrically connected.

In the case where one buffer 116 is electrically connected to a plurality of vertical signal lines 107, a reduction in the number of buffers 116 is achieved compared with the case in which one buffer 116 is electrically connected to each vertical signal line 107. Thus, it is possible to reduce the size of the peripheral circuit area around the pixel array area including the array of pixels 100 and vertical signal lines 107 electrically connected to the pixels 100. However, as the number of vertical signal lines 107 electrically connected to one buffer 116 increases, the difference increases in terms of impedance of each vertical signal line 107 between the image taking operation and the test operation, which results in a reduction in test accuracy. Therefore, to achieve high test accuracy, each vertical signal line 107 may be electrically connected to one buffer 116.

In the case where the power supply circuit 118 has the function of switching the voltage supplied to the buffers 116 depending on whether the test operation or the image taking operation is performed, the test selection MOS transistors 117 and the test pulse apply terminal 119 may be removed.

The power supply circuit 118 may further include buffers such as a voltage follows in addition to the buffers 116.

In the present embodiment, each buffer 116 and each amplifying MOS transistor 104 may be formed so as to be similar in structure thereby to make the test signal more similar to the signal output from pixels in the image taking operation.

Figure 8A:
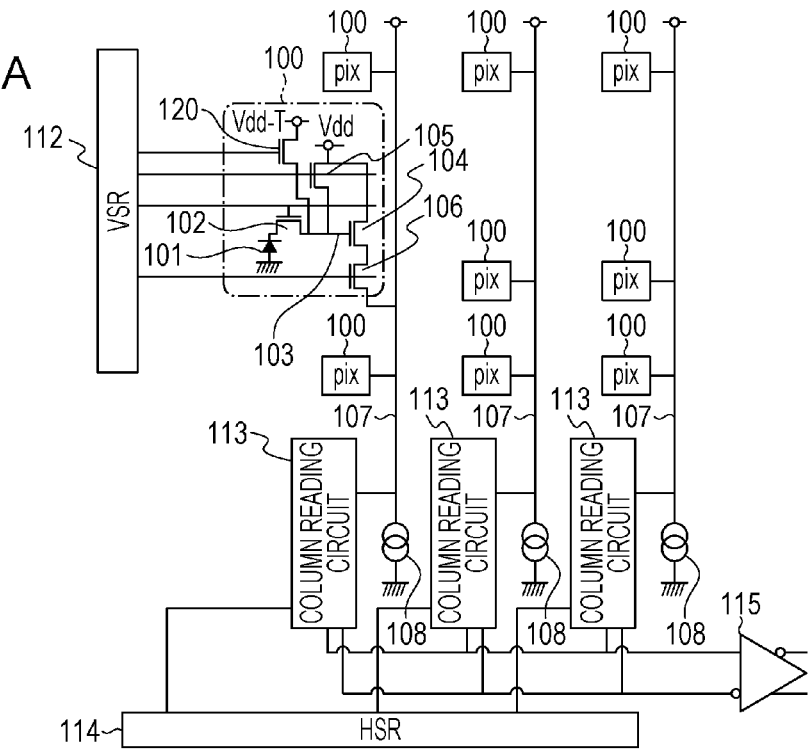
FIG. 8A and FIG. 8B are block diagrams schematically illustrating examples of configurations of an image pickup apparatus according to an embodiment.
Figure 8B:
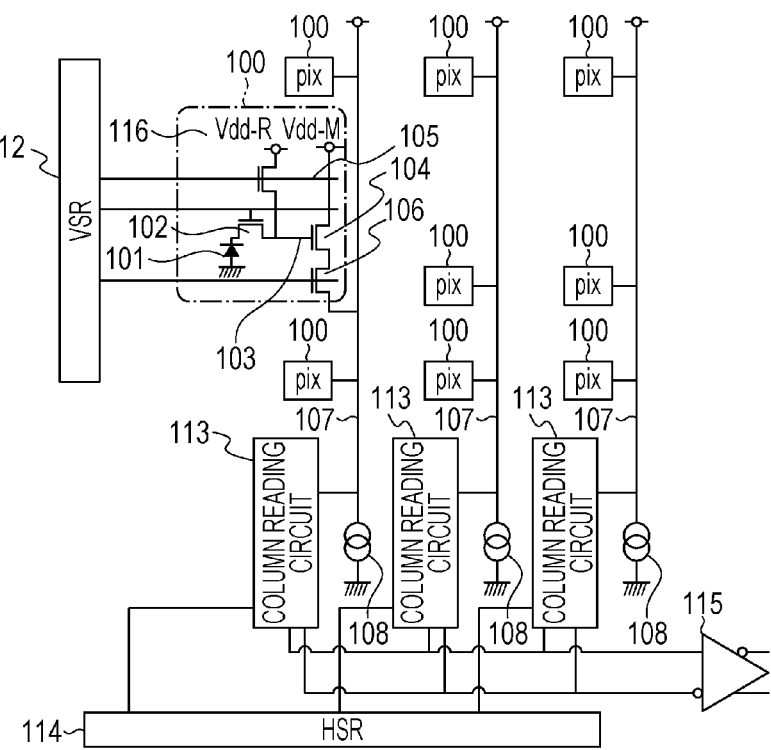

In the examples described above, the buffers 116 and the test selection MOS transistors 117 are disposed outside the pixels 100. Alternatively, at least one of the pixels 100 electrically connected to the respective column reading circuits 113 may be a signal output pixel having functions corresponding to the buffer 116 and the test selection MOS transistor 117. FIGS. 8A and 8B illustrate examples of such pixels 100 configured to have functions corresponding to the buffer 116 and the test selection MOS transistor 117.

In FIGS. 8A and 8B, elements that are similar in function to those shown in FIG. 1 are denoted by similar reference symbols or numerals, and a further description thereof is omitted. In the example shown in FIG. 8A, the FD part 103 is electrically connected to a switch 120 in addition to the reset MOS transistor 105. As shown in FIG. 8A, the switch 120 is connected such that a gate thereof is electrically connected to the VSR 112, a drain thereof is electrically connected to voltage Vdd-T, and a source thereof is electrically connected to the FD part 103. In the test operation, the selection MOS transistor 106 functions as the test selection MOS transistor 117.

In the example shown in FIG. 8B, the amplifying MOS transistor 104 and the selection MOS transistor 106 in each pixel 100 respectively operate as the buffer 116 and the test selection MOS transistor 117 in the test operation. In the configuration shown in FIG. 8B, the drain of the reset MOS transistor 105 is electrically connected to a voltage Vdd-R, and the drain of the amplifying MOS transistor 104 is electrically connected to a voltage Vdd-M. That is, the drains of the reset MOS transistor 105 and the amplifying MOS transistor 104 are electrically connected to different voltage sources. In the image taking operation, values of the voltage Vdd-R and the voltage Vdd-M are equal to the voltage Vdd applied to the reset MOS transistors 105 and the amplifying MOS transistor 104 of other pixels 100 having no test function. This is because if the voltage Vdd-R is different from the voltage Vdd, a difference occurs in reset level of the FD part 103 between pixels having the test function and pixels having no test function. On the other hand, if the voltage Vdd-M is different from the voltage Vdd, a difference occurs in signal output from the amplifying MOS transistor 104 between pixels having the test function and pixels having no test function.

In the operation of testing the column reading circuits 113, the voltage Vdd-M set to a value different from the voltage Vdd-R is supplied to the amplifying MOS transistor 104. More specifically, the voltage Vdd-M may be set to a particular value such that the amplifying MOS transistor 104 outputs a voltage corresponding to the signal output by the amplifying MOS transistor 104 in the image read process in the image taking operation. The test signal output from the amplifying MOS transistor 104 is supplied to the column reading circuit 113 via the selection MOS transistor 106 and the vertical signal line 107.

In the configurations shown in FIG. 8A and FIG. 8B, it is possible to perform the image taking operation and the operation of testing the column reading circuits 113 according to the drive timing chart shown in FIG. 2.

In the present embodiment, the power supply circuit 118 does not necessary need to be disposed on the same semiconductor substrate as that on which the pixel array area is formed. That is, an SRU test system may be configured such that the power supply circuit 118 is disposed outside the semiconductor substrate on which the pixel array area is formed and the power supply circuit 118 is electrically connected to the semiconductor substrate. However, by disposing the pixel array area and the power supply circuit 118 on the same semiconductor substrate, it is possible to reduce the distance between the power supply circuit 118 to the buffers 116, which makes it possible to reduce the total circuit area size.

In the image pickup apparatus according to the present embodiment, a plurality of buffers 116 for supplying the test signal are provided, and there is at least one buffer 116 electrically connected to one signal line 107 different from another signal line 107 to which another one of the buffers 116 is electrically connected. This reduces a difference in impedance among columns when the test signal is supplied, which makes it possible to accurately measure the characteristic of column reading circuits 113 in the respective columns. This makes it possible to precisely detect a difference in characteristic among the column reading circuits 113, and thus it becomes possible to accurately correct the characteristic of the respective column reading circuits 113.

Furthermore, the provision of the power supply circuit 118 makes it possible for the buffers 116 to supply the test signal corresponding to the pixel signal output by the amplifying MOS transistor 104 in the image taking operation. This makes it possible to test the characteristic of the column reading circuits 113 under the conditions similar to those under which the image taking operation is performed. Note that in the image taking operation, the pixel signal output from the amplifying MOS transistor 104 may change within a range from a value obtained when the potential of the FD part 103 is at the reset level to a value obtained when the FD part 103 is in a saturated state.

Second Embodiment

Figure 3:
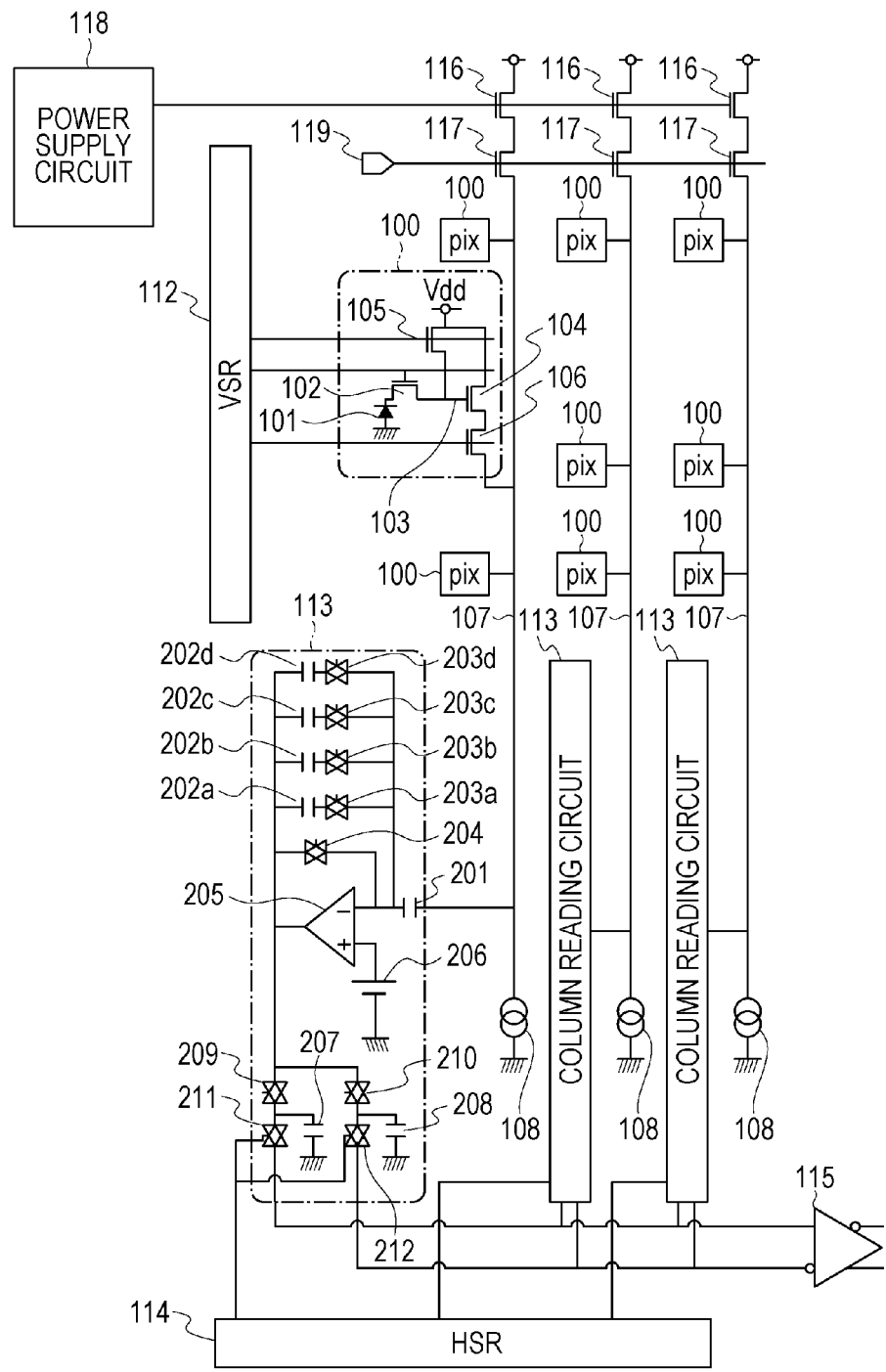
FIG. 3 is a block diagram schematically illustrating a second embodiment.

FIG. 3 is a block diagram schematically illustrating a second embodiment. In FIG. 3, elements that are similar in function to those shown in FIG. 1 are denoted by similar reference symbols or numerals. The following description will focus on differences from the first embodiment.

In FIG. 3, reference numeral 201 denotes a clamping capacitor, reference numerals 202a to 202d denote feedback capacitors, reference numerals 203a to 203d denote switches for switching the feedback capacitance. Reference numerals 204 and 209 to 212 denote switches. Reference numeral 205 denotes an operational amplifier, reference numeral 206 denotes a reference voltage source that supplies a reference voltage Vref, and reference numerals 207 and 208 denote capacitors in which signals are written.

Figure 4:
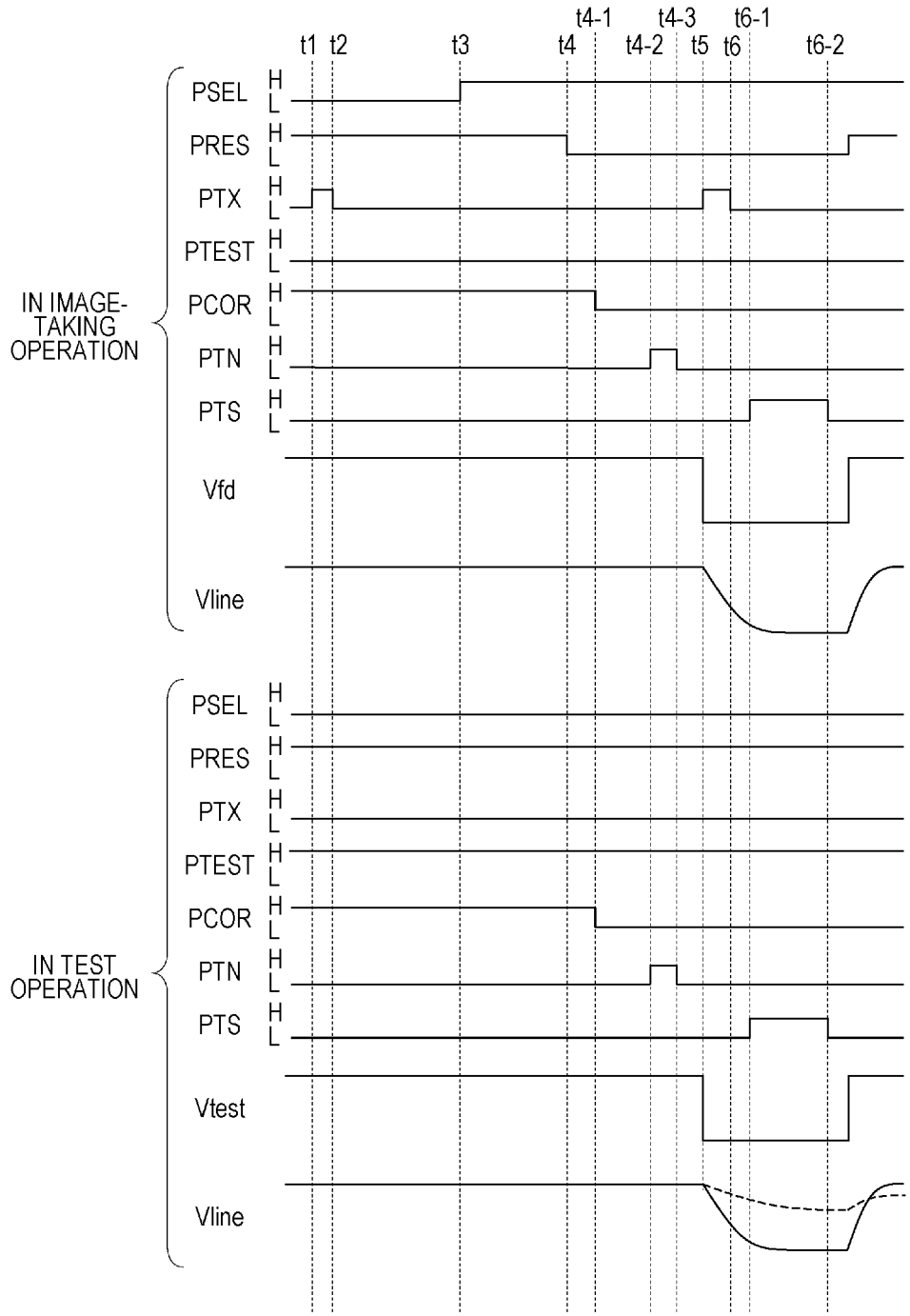
FIG. 4 is a drive timing chart according to the second embodiment.

FIG. 4 illustrates drive timing of the image pickup apparatus shown in FIG. 3. In FIG. 4, similar pulses to those in FIG. 2 are denoted by similar reference symbols. In FIG. 4, PTS denotes a pulse applied to the switch 210. PTN denotes a pulse applied to the switch 209, and PC0R denotes a pulse applied to the switch 204.

At time t4, PRES is turned to the L level to release the FD part 103 from the reset state. During a period till time t4, PC0R is at the H level, and thus the operational amplifier 205 functions as a buffer.

At time t4-1, PC0R is turned to the L level, and then at time t4-2, PTN is turned to the H level thereby turning on the switch 209. As a result, a voltage VN equal to the reference voltage applied as an N signal to the operational amplifier 205 plus the offset voltage of the operational amplifier 205 is written into the capacitor 207.

At time t4-3, PTN is turned to the L level to end the writing of the N signal into the capacitor 207.

Next, at time t5, PTX is turned to the H level and then at time t6 PTX is turned to the L level. As a result, a signal corresponding to the charge in the photodiode 101 is transmitted to the column reading circuit 113. At this point of time, the voltage of the vertical signal line 107 changes, and at least one of the switches 203a to 203d turns on. The operational amplifier 205 has, at its output terminal, an inverting gain equal to the ratio of the total capacitance Cf_total of the feedback capacitors 202a to 202d electrically connected in a feedback path of the operational amplifier 205 to the capacitance C0 of the clamping capacitor 201.

At time t6-1, PTS is turned to the H level thereby to turn on the switch 210. As a result, a voltage VS is written as an S signal into the capacitor 208.

At time t6-2, PTS is turned to the L level to end the writing into the capacitor 208.

Signals processed by the column reading circuits 113 are sequentially output by the HSR 114 to the output amplifier 115. The output amplifier 115 extracts the difference between the S signal and the N signal and outputs the result as a voltage VS-VN.

By performing CDS in the signal reading process in the image taking operation in the above-described manner, it is possible to reduce noise caused by the difference in threshold value of the amplifying MOS transistor 104 among the pixels and by the offset voltage of the operational amplifier 205.

Similarly, also in the operation of testing the column reading circuits 113, by performing CDS, it is possible to reduce noise caused by the difference in threshold value of buffers 116 and by the offset voltage of the operational amplifier 205.

A transient response may occur in the potential Vline of the vertical signal line 107 when the pixel signal or the test signal is transmitted. Therefore, the value of the voltage written in the capacitor 208 may vary depending on the length of the period from time t5 to time t6-2. Therefore, if the length of the period from time t5 to time t6-2 is not substantially equal between the image taking operation and the test operation, a difference may occur in the signal output from the column reading circuit 113 between the image taking operation and the test operation, which results in a reduction in the test accuracy. Note that as the gain (C0/Cf_total) of the column reading circuit 113 increases, the transient period of the signal output from the operational amplifier 205 increases. Thus, the value of the voltage written in the capacitor 208 varies depending on the length of the period from time t5 to time t6-2.

Another effect obtained by providing the buffers 116 for respective columns is a reduction in noise. By minimizing the length of the period from time t4-3 at which the writing of VN is ended to time t6-2 at which the writing of VS is ended, it is possible to minimize the influence of 1/f noise of the amplifying MOS transistor 104 that outputs the N signal and the S signal.

In the image pickup apparatus according to the present embodiment, a plurality of buffers 116 for supplying the test signal are provided, and there is at least one buffer 116 electrically connected to one vertical signal line 107 different from another vertical signal line 107 to which another one of the buffers 116 is electrically connected. This reduces a difference in impedance of the vertical signal line 107 among columns when the test signal is supplied, which results in an increase in test accuracy. Because the buffers 116 and the test selection MOS transistors 117 are similar in structure to the amplifying MOS transistors 104 and the selection MOS transistors 106 in the respective pixels 100, it is possible to test the column reading circuits 113 under conditions similar to those in the image taking operation.

Third Embodiment

Figure 5:
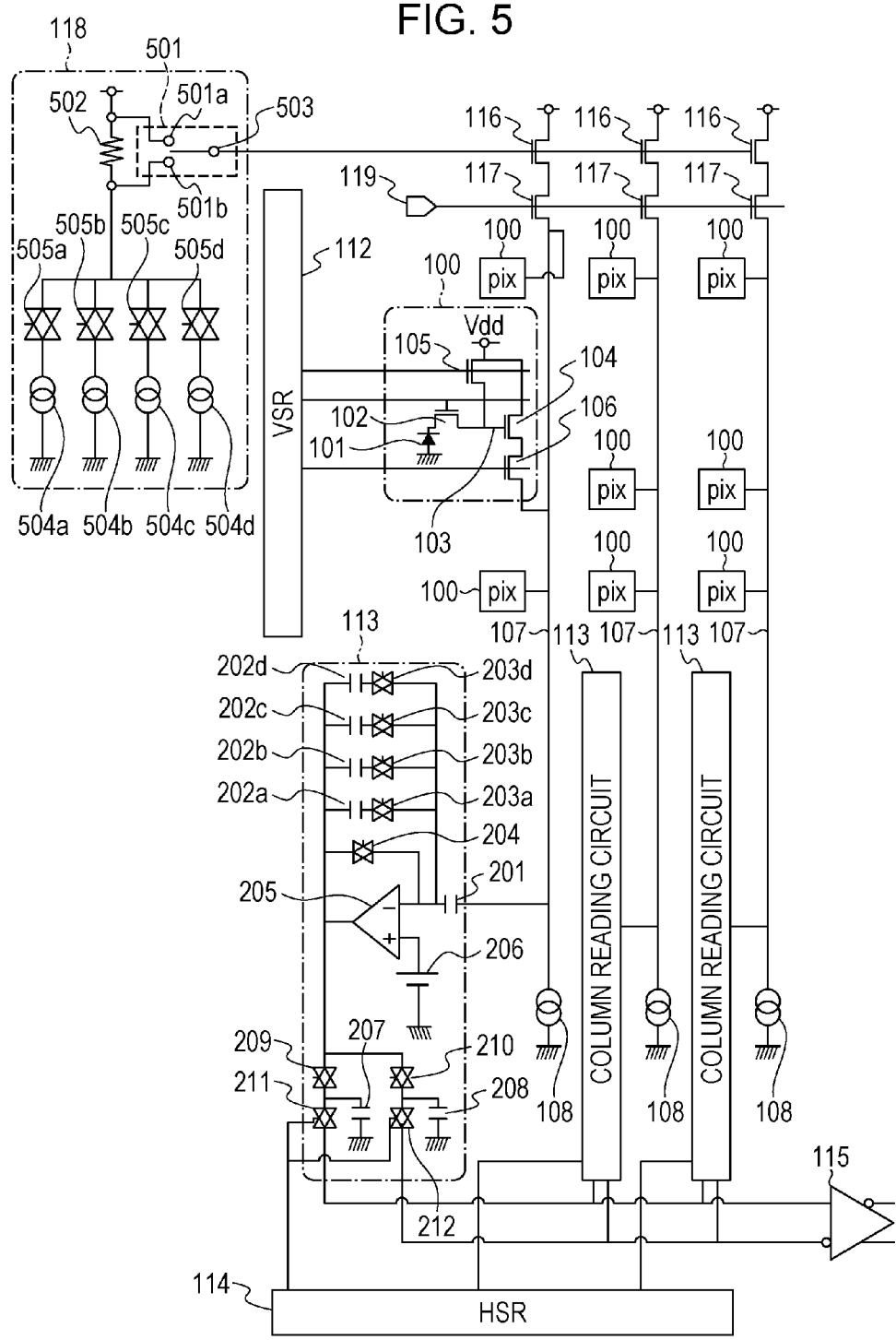
FIG. 5 is a block diagram schematically illustrating a third embodiment.

FIG. 5 is a block diagram schematically illustrating a third embodiment. In FIG. 5, elements that are similar in function to those shown in FIG. 3 are denoted by similar reference symbols or numerals. The following description will focus on differences from the second embodiment.

In the image pickup apparatus according to the present embodiment, the power supply circuit 118 is configured as shown in FIG. 5. Reference numeral 501 denotes a test signal switch. When the test signal switch turns to a side of terminal 501a, a voltage VtestN is output. On the other hand, when the test signal switch turns to a side of terminal 501b, a voltage VtestS is output. An output terminal 503 of the test signal switch is electrically connected to the gates of the buffers 116. VtestN and VtestS are test signals corresponding to the N signal and the S signal output from the pixels 100 in the image taking operation. Therefore, VtestN may set to a voltage corresponding to the voltage of the FD part 103 in the reset state in the image taking operation. More specifically, VtestN may set to a voltage lower than the drain voltage Vdd of the reset MOS transistor 105 by a feedthrough voltage (0.3 to 1 volts) that occurs when the reset MOS transistor 105 turns off. By selecting a constant current source that supplies a current by switching current source switches 505a to 505d to select one of constant current sources 504a to 504d, the voltage VtestS is determined and supplied to the buffers 116.

If the value of VtestS is switched according to a technique other than the present embodiment, a problem may occur. For example, if the value of VtestS is switched using a ladder resistor, an influence of a difference in contact resistance may occur. However, in the power supply circuit 118 according to the present embodiment, whatever value is selected for VtestS, the voltage is output from the same resistor 502, and thus no effect due to difference in contact resistance occurs. Therefore, it is possible to obtain a voltage precisely proportional to the current supplied by one of the constant current sources 504a to 504d.

Even when intensity of incident light is equal for all columns, a slight difference in output signal among columns may occur due to a difference in characteristic among the column reading circuits 113 originating from a difference in production condition.

The above-described difference in the output signal is caused by a column-to-column difference in feedback capacitance created during the production process. In particular, when the gain (C0/Cf_total) is large, small capacitance is selected from the feedback capacitors 202a to 202d, which results in an increase in influence of difference in feedback capacitance among columns. To compensate for the difference in characteristic of the feedback capacitance among columns, it is necessary to perform, in advance, a test by sampling the output values of the respective columns. By performing compensation based on the output values, it becomes possible to obtain high-quality images in the image taking operation. Because the feedback capacitance varies depending on the selected gain, the test may be performed for each gain value.

Thus, by configuring the power supply circuit 118 to have a circuit for switching the value of the voltage VtestS, it becomes possible to supply the test signal depending on the selected gain and perform the test for each gain value. By performing the test for each gain value, it is possible to correct the output characteristic of the respective column reading circuits 113 for each gain value.

A buffer such as a voltage follower may be further provided between the output terminal 503 and each buffer 116.

Figure 6:
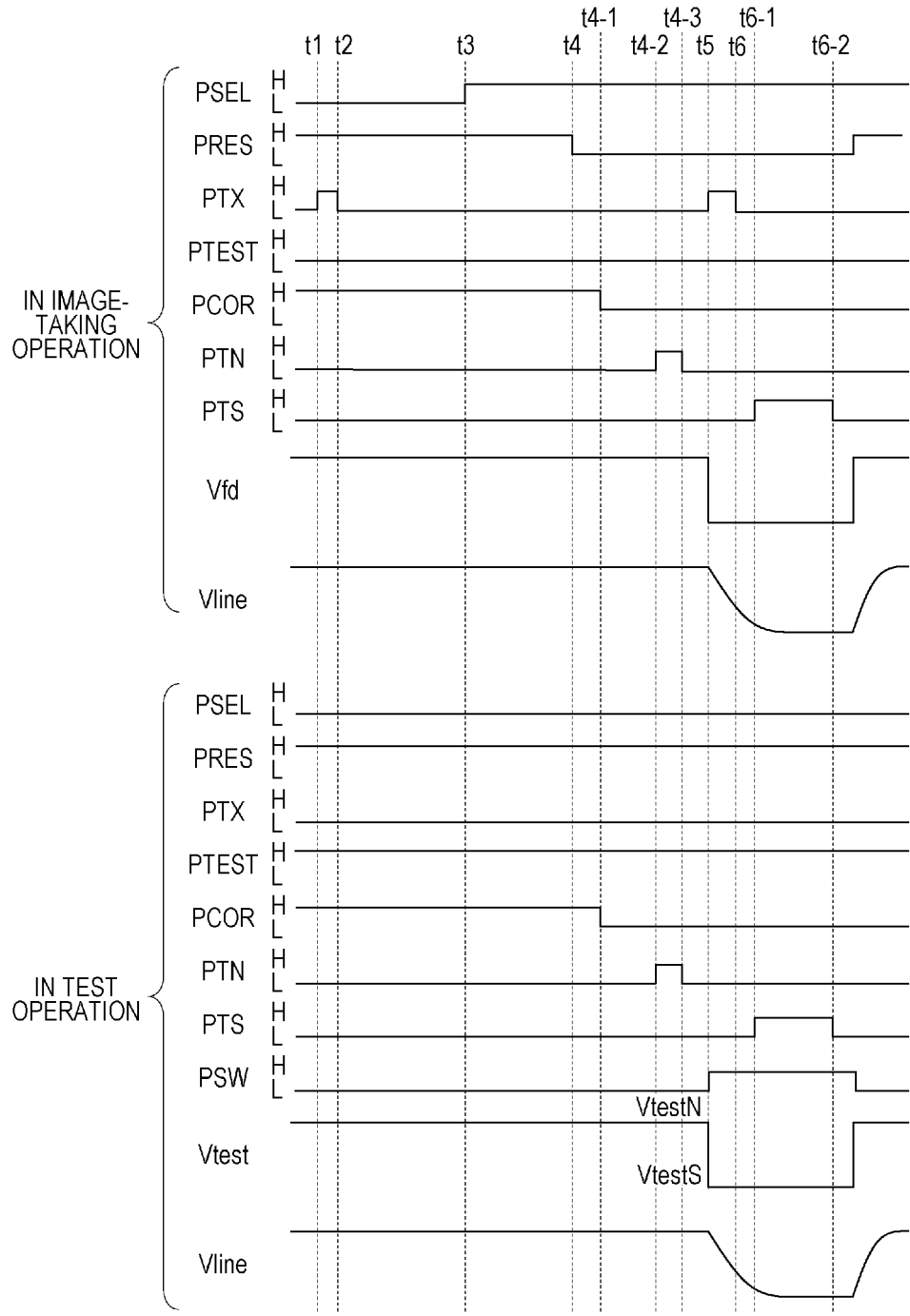
FIG. 6 is a drive timing chart according to the third embodiment.

FIG. 6 is a drive timing chart of the operation using the power supply circuit 118 configured in the above-described manner according to the present embodiment. In FIG. 6, similar pulses to those in FIG. 4 are denoted by similar reference symbols. In FIG. 6, PSW denotes a pulse that drives the test signal switch 501. When PSW is at the H level, VtestN is output, while VtestS is output when PSW is at the L level. The level of PSW is turned at a time corresponding to time t5 shown in FIG. 2 or FIG. 4 such that the test signal is turned from the voltage VtestN to the voltage VtestS.

In the image pickup apparatus according to the present embodiment, by sequentially selecting VtestS and VtestN and supplying the selected voltage, the signal corresponding to the signal that is output in the image taking operation by the amplifying MOS transistor 104 of the pixels is supplied as the test signal to the column reading circuits 113, and thus it is possible to perform the test with high accuracy. Furthermore, in the present embodiment, it is possible to test the column reading circuits 113 for each variable gain value of the column reading circuit 113, which makes it possible to make a high-accuracy correction on the signal in the image taking operation.

Fourth Embodiment

Figure 7:
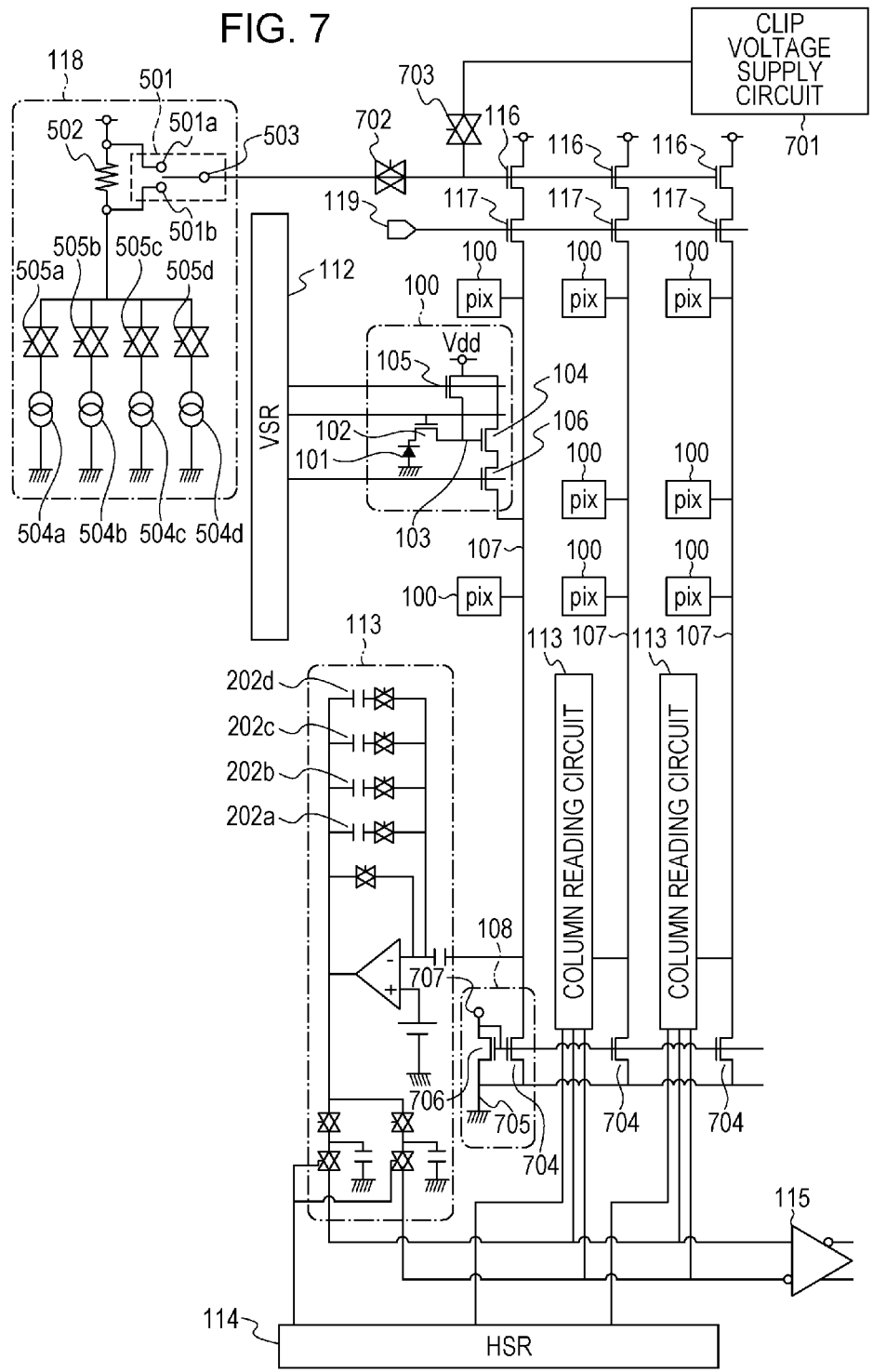
FIG. 7 is a block diagram schematically illustrating a fourth embodiment.

FIG. 7 is a block diagram schematically illustrating a fourth embodiment. In FIG. 7, elements that are similar in function to those shown in FIG. 5 are denoted by similar reference symbols or numerals. The following description will focus on differences from the third embodiment.

In the image pickup apparatus according to the present embodiment. The gate of each buffer 116 is electrically connected to the power supply circuit 118 and a clip voltage supply circuit 701. The circuit of the image pickup apparatus shown in FIG. 7 includes a switch 702 and a switch 703. In the test operation, the switch 702 electrically connects the power supply circuit 118 to the buffers 116. In the image taking operation, the switch 703 electrically connects the clip voltage supply circuit 701 to the buffers 116. The constant current source 108 includes an input MOS transistor 706 whose drain is electrically connected to a current input terminal 707, a load MOS transistor 704 whose drain is electrically connected to one of the vertical signal lines 107, and a GND (ground) line 705 electrically connected to GND.

In the image pickup apparatus according to the present embodiment, in the signal reading operation, as the signals output from the pixels 100 increase, the voltages on the vertical signal lines 107 decrease. Each vertical signal line 107 is electrically connected to the drain of corresponding one of the load MOS transistors 704. In this configuration, when signals are being read from pixels in a particular column, if the intensity of light incident on the pixels in this column is very high, the source-drain voltage of the load MOS transistor 704 becomes nearly equal to 0 volts. When the intensity of the incident light is extremely high, the load MOS transistor 704 turns off. The current flowing through the GND line 705 in a state in which a certain row is being read varies depending on the number of load MOS transistors 704 that are in the OFF state.

Because the GND line 705 has impedance, when the current flows through the GND line 705, a voltage drop occurs in the GND line 705, which causes a change in the current flowing through the load MOS transistor. The greater the number of pixels that receive high-intensity incident light in a row, the smaller the voltage drop on the GND line 705 and the greater the current flowing through the load MOS transistor 704. Thus, in rows having a large number of pixels receiving high-intensity incident light, the amplifying MOS transistor 104 has a large gate-source voltage. This causes a difference in pixel signal output range between rows having pixels receiving high-intensity incident light and other rows. As a result, when an image being taken has a high-intensity light spot, white streaks may occur to the right and left of the spot.

In view of the above, the present embodiment provides the clip voltage supply circuit 701 to limit the voltage of each vertical signal line 107 to the range below the set clip voltage. The clip voltage may be set such that the drain voltage of the load MOS transistor 704 does not decrease below a limit below which the load MOS transistor 704 would operate in the saturated region. Thus, even when an extremely large amount of signal charge is read, the voltage of the vertical signal line 107 is maintained in the range higher the above-described limit, which leads to a reduction in change in current supplied from the load MOS transistor 704 to the vertical signal line 107. Furthermore, the load MOS transistor 704 is prevented from turning off. Thus, it becomes possible to reduce the change in voltage drop on the GND line 705 depending on the number of pixels receiving high-intensity incident light, and thus it becomes easy to maintain the current of the load MOS transistor 704 at the set constant value regardless of which row is read. As a result, the substantially same pixel signal output range is obtained regardless of whether the row includes pixels receiving high-intensity incident light. This prevents white streaks from appearing in an image including a high-intensity light spot, and thus a high-quality image can be obtained.

In the image pickup apparatus according to the present embodiment, in the operation of testing the column reading circuits 113, the buffers 116 are used in a similar manner to that according to the second embodiment. On the other hand, in the image taking operation, the clip voltage supply circuit 701 is electrically connected to the buffers 116 to supply the clip voltage thereto.

In the example described above, the clip voltage supply circuit 701 is provided separately from the power supply circuit 118. Alternatively, the power supply circuit 118 may operate also as the clip voltage supply circuit such that in the operation of testing the column reading circuits 113, the power supply circuit 118 outputs the test signal, while in the image taking operation, the power supply circuit 118 supplies the clip voltage to the buffer 116. By configuring the power supply circuit 118 to operate also as the clip voltage supply circuit, it is possible to reduce the total circuit size.

In the present embodiment, the signal based on the charge held by the FD part 103 is output by the amplifying MOS transistor 104 to the vertical signal line 107, and the clip voltage supply circuit 701 prevents the potential of the vertical signal line 107 from dropping below the clip voltage. On the other hand, in the case where the signal based on the hole held by the FD part 103 is output by the amplifying MOS transistor 104 to the vertical signal line 107, the clip voltage supply circuit 701 may prevent the potential of the vertical signal line 107 from increasing beyond the clip voltage.

By configuring the image pickup apparatus to include the SRU test circuit according to one of the first to fourth embodiments described above, it becomes possible to test the SRUs of the image pickup apparatus during a process of producing the image pickup apparatus. By performing the test, it is possible to detect whether the image pickup apparatus has a failure in its SRUs. When the image pickup apparatus is subjected to the test, if the test indicates that signal characteristics of SRUs in the image pickup apparatus are different among the SRUs, then the differences in signal characteristics may be corrected based on the result of the test performed using the SRU test circuit. To perform the correction, a correction unit electrically connected to the image pickup apparatus may be provided in the outside of the image pickup apparatus, and the correction unit may correct signals output from the image pickup apparatus or may correct the signal characteristics of the SRUs of the image pickup apparatus. By testing the SRUs in the above-described manner, it becomes possible to produce the image pickup apparatus having the SRUs with good characteristics. Also in a process of producing an image pickup system including an image pickup apparatus, a lens for forming an optical image of an object on the image pickup apparatus, and a signal processing unit for processing a signal output from the image pickup apparatus, SRUs may be tested using the SRU test circuit according to one of the first to fourth embodiments described above. By performing the test of the SRUs, it becomes possible to produce the image pickup system including the image pickup apparatus having the SRUs with good characteristics. The above-described correction unit disposed in the outside of the image pickup apparatus to correct differences in signal characteristics among the SRUs based on the result of the test performed using the SRU test circuit may be disposed in the signal processing unit. The test of the SRUs may be performed before the image pickup apparatus is installed in the image pickup system or after the image pickup apparatus is installed in the image pickup system. In the case where the test of the SRUs is performed before the image pickup apparatus is installed in the image pickup system, when the image pickup apparatus has a failure, the test can detect the failure and thus the performing of the test can reduce the probability that the image pickup apparatus having the failure is installed in the image pickup system, which results in a reduction in production cost.

According to an aspect of the embodiments, there is provided an SRU test circuit including a test signal supply unit configured to supply a test signal via a signal line to SRUs provided in a plurality of columns, wherein the test signal supply unit is a voltage buffer or a current buffer, and the SRU test circuit has a plurality of test signal supply units and a plurality of signal lines, and there is at least one test signal supply unit electrically connected to one signal line different from a signal line to which another test signal supply unit is electrically connected.

According to another aspects of the embodiments, there is provided a method of testing SRUs provided in a plurality of columns, the method including supplying a test signal to the SRUs from a plurality of voltage buffers or current buffers functioning as test signal supply units such that one of the test signal supply units supplies the test signal to an SRU different from an SRU to which the test signal is supplied from another different test signal supply unit, and testing the SRUs using the test signal supplied to the SRUs.

While the embodiments have been described with reference to exemplary embodiments, it is to be understood that the embodiments are not limited to the disclosed exemplary embodiments. The scope of the following claims is to be accorded the broadest interpretation so as to encompass all such modifications and equivalent structures and functions.

This application claims the benefit of Japanese Patent Application No. 2011-051692 filed Mar. 9, 2011, which is hereby incorporated by reference herein in its entirety.

What is claimed is:

1. A test circuit comprising:
    a test signal supply unit configured to supply a test signal via a signal line to signal receiving units provided in a plurality of columns, wherein
    the test signal supply unit is a voltage buffer or a current buffer, and the test circuit has a plurality of test signal supply units, and
    wherein at least one test signal supply unit is electrically connected to one signal line different from a signal line to which another test signal supply unit is electrically connected.

2. The test circuit according to claim 1, wherein each of the test signal supply units is electrically connected to one of the signal lines.

3. The test circuit according to claim 1, further comprising a power supply electrically connected to the test signal supply units and configured to drive the test signal supply units to supply the test signal.

4. The test circuit according to claim 3, wherein the power supply is a voltage source configured to select a voltage value to be supplied to each test signal supply unit from a plurality of voltage values.

5. The test circuit according to claim 4, wherein each signal receiving unit performs correlated double sampling on the test signal supplied from the test signal supply unit based on the plurality of voltage values.

6. The test circuit according to claim 3, wherein
    the signal receiving units are disposed on a semiconductor substrate, and
    the power supply is disposed outside the semiconductor substrate.

7. The test circuit according to claim 3, wherein
    the signal receiving units are disposed on a semiconductor substrate, and
    the power supply is disposed on the semiconductor substrate.

* * * * *